United States Patent
Su

(10) Patent No.: US 12,308,290 B2
(45) Date of Patent: May 20, 2025

(54) METHOD FOR PREPARING SEMICONDUCTOR DEVICE STRUCTURE WITH FLUORINE-CATCHING LAYER

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 359 days.

(21) Appl. No.: 17/746,737

(22) Filed: May 17, 2022

(65) Prior Publication Data
US 2023/0402319 A1    Dec. 14, 2023

(51) Int. Cl.
  H01L 21/768    (2006.01)
  H01L 23/522    (2006.01)
  H01L 23/532    (2006.01)

(52) U.S. Cl.
CPC .. H01L 21/76843 (2013.01); H01L 21/76805 (2013.01); H01L 21/76831 (2013.01);
(Continued)

(58) Field of Classification Search
CPC ......... H01L 21/76843; H01L 21/76805; H01L 21/76831; H01L 21/76802; H01L 21/76804; H01L 21/5226; H01L 21/76846; H01L 21/76847; H01L 21/76849; H01L 23/5226; H01L 23/53238; H01L 23/53266; H01L 23/26
See application file for complete search history.

(56) References Cited

U.S. PATENT DOCUMENTS

2001/0022398 A1*  9/2001  Grill ................ H01L 21/76846
                                              257/E21.264
2002/0153547 A1   10/2002  Kajiyama
                           (Continued)

FOREIGN PATENT DOCUMENTS

TW         475238 B    2/2002
TW        I248660 B    2/2006
               (Continued)

OTHER PUBLICATIONS

Office Action dated Mar. 13, 2023, the search report attached to the Office Action, and the cited references.
(Continued)

*Primary Examiner* — Latanya N Crawford Eason
(74) *Attorney, Agent, or Firm* — Muncy, Geissler, Olds & Lowe, P.C.

(57) ABSTRACT

The present disclosure provides a method for preparing a semiconductor device structure with a fluorine-catching layer. The method includes forming a first dielectric layer over a semiconductor substrate, and forming a first conductive via structure in the first dielectric layer. The method also includes forming a second dielectric layer over the first dielectric layer and covering the first conductive via structure, and forming a fluorine-catching layer over the second dielectric layer. The method further includes forming a third dielectric layer over the fluorine-catching layer, and forming a second conductive via structure in the third dielectric layer, the fluorine-catching layer, and the second dielectric layer.

15 Claims, 20 Drawing Sheets

(52) U.S. Cl.
CPC .... *H01L 23/5226* (2013.01); *H01L 23/53238* (2013.01); *H01L 23/53266* (2013.01)

(56) References Cited

U.S. PATENT DOCUMENTS

2014/0284734 A1    9/2014   Kanaya et al.
2021/0296116 A1    9/2021   Asakawa et al.

FOREIGN PATENT DOCUMENTS

TW    202141697 A    11/2021
TW       I765668 B    11/2021
TW    202217974 A     5/2022

OTHER PUBLICATIONS

Notice of Allowance dated Apr. 27, 2023, the search report attached to the Notice of Allowance, and the cited references.

* cited by examiner

METHOD FOR PREPARING SEMICONDUCTOR DEVICE STRUCTURE WITH FLUORINE-CATCHING LAYER

TECHNICAL FIELD

The present disclosure relates to a method for preparing a semiconductor device structure, and more particularly, to a method for preparing a semiconductor device structure with a fluorine-catching layer.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a fluorine-catching layer disposed over the second dielectric layer, and a third dielectric layer disposed over the fluorine-catching layer. The semiconductor device structure further includes a conductive via structure penetrating through the third dielectric layer, the fluorine-catching layer, and the second dielectric layer to contact the first dielectric layer.

In an embodiment, the conductive via structure is in direct contact with the fluorine-catching layer. In an embodiment, the third dielectric layer is separated from the second dielectric layer by the fluorine-catching layer. In an embodiment, the fluorine-catching layer includes calcium (Ca). In an embodiment, the fluorine-catching layer includes $CaSiO_2$, $CaF_2$, or a combination thereof.

In an embodiment, the conductive via structure includes a conductive layer disposed over the first dielectric layer, an inner barrier layer surrounding the conductive layer, and an outer barrier layer surrounding the inner barrier layer. In an embodiment, a portion of the inner barrier layer is sandwiched between the conductive layer and the first dielectric layer, and the portion of the inner barrier layer has a bottom surface that is substantially level with a bottom surface of the outer barrier layer. In an embodiment, the semiconductor device structure further includes another conductive via structure penetrating through the first dielectric layer to contact the semiconductor substrate. In an embodiment, the semiconductor device structure further includes an etch stop layer disposed between the conductive via structure and the first dielectric layer.

In another embodiment of the present disclosure, a semiconductor device structure is provided. The semiconductor device structure includes a first dielectric layer disposed over a semiconductor substrate, and a first conductive via structure disposed over the semiconductor substrate and surrounded by the first dielectric layer. The semiconductor device structure also includes a second dielectric layer disposed over the first dielectric layer and covering the first conductive via structure, and a fluorine-catching layer disposed over the second dielectric layer. The semiconductor device structure further includes a second conductive via structure disposed over the first dielectric layer and surrounded by the second dielectric layer and the fluorine-catching layer.

In an embodiment, the fluorine-catching layer includes $CaSiO_2$, $CaF_2$, or a combination thereof. In an embodiment, the semiconductor device structure further includes a third dielectric layer disposed over the fluorine-catching layer and surrounding the second conductive via structure. In an embodiment, the first conductive via structure includes a conductive layer and a barrier layer separating the conductive layer from the first dielectric layer. In an embodiment, the conductive via of the first conductive via structure includes Cu, and the barrier layer of the first conductive via structure includes TaN.

In an embodiment, the second conductive via structure includes a conductive layer, an inner barrier layer surrounding the conductive layer, and an outer barrier layer separating the inner barrier layer from the second dielectric layer and the fluorine-catching layer. In an embodiment, the conductive layer of the second conductive via structure includes Cu, the inner barrier layer of the second conductive via structure includes CuBS, and the outer barrier layer of the second conductive via structure includes TaN. In an embodiment, the semiconductor device structure further includes an etch stop layer disposed between the first conductive via structure and the second conductive via structure, wherein the inner barrier layer of the second conductive via structure is in direct contact with the etch stop layer.

In yet another embodiment of the present disclosure, a method for preparing a semiconductor device structure is provided. The method includes forming a first dielectric layer over a semiconductor substrate, and forming a first conductive via structure in the first dielectric layer. The method also includes forming a second dielectric layer over the first dielectric layer and covering the first conductive via structure, and forming a fluorine-catching layer over the second dielectric layer. The method further includes forming a third dielectric layer over the fluorine-catching layer, and forming a second conductive via structure in the third dielectric layer, the fluorine-catching layer, and the second dielectric layer.

In an embodiment, the formation of the first conductive via structure includes performing a first etching process to form a first opening penetrating through the first dielectric layer, forming a barrier layer lining a bottom surface and sidewalls of the first opening, and forming a conductive layer in the first opening and over the barrier layer. In an embodiment, the formation of the second conductive via structure includes performing a second etching process to form a second opening penetrating through the third dielectric layer, the fluorine-catching layer, and the second dielectric layer, and forming an outer barrier layer lining a bottom surface and sidewalls of the second opening. In addition, the formation of the second conductive via structure includes forming an inner barrier layer in the second opening and over the outer barrier layer, and forming a conductive layer in the second opening and over the inner barrier layer.

In an embodiment, the formation of the second conductive via structure further includes partially removing the outer barrier layer before the inner barrier layer is formed, and forming the inner barrier layer such that a bottom surface of the inner barrier layer is substantially level with a bottom surface of the outer barrier layer. In an embodiment, the second etching process includes a dry etching process using an etchant including a fluorine-containing gas. In an embodiment, the fluorine-catching layer includes $CaSiO_2$, and the fluorine-containing gas reacts with the fluorine-catching layer to transform at least a portion of the fluorine-catching layer into $CaF_2$.

In an embodiment, the fluorine-catching layer has a first fluorine content before the outer barrier layer is formed, the fluorine-catching layer has a second fluorine content after the partially removal of the outer barrier layer, and the second fluorine content is greater than the first fluorine content. In an embodiment, the method further includes forming an etch stop layer over the first dielectric layer and covering the first conductive via structure before the second dielectric layer is formed, wherein the second conductive via structure is formed over and in direct contact with the etch stop layer.

Embodiments of a semiconductor device structure and method for preparing the same are provided in the disclosure. In some embodiments, the semiconductor device structure includes a fluorine-catching layer between two dielectric layers, and a conductive via structure penetrating through the fluorine-catching layer and the two dielectric layers. A fluorine-containing gas may be used as an etchant during the process steps that provide the opening for the conductive via structure, and the fluorine-containing gas may react with the fluorine-catching layer to transform at least a portion of the fluorine-catching layer into a fluoride. The use of the fluorine-catching layer can reduce fluorine contamination to the conductive features, such that the electrical characteristics of the conductive features will not be affected. As a result, the performance, reliability and yield of the semiconductor device structure can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
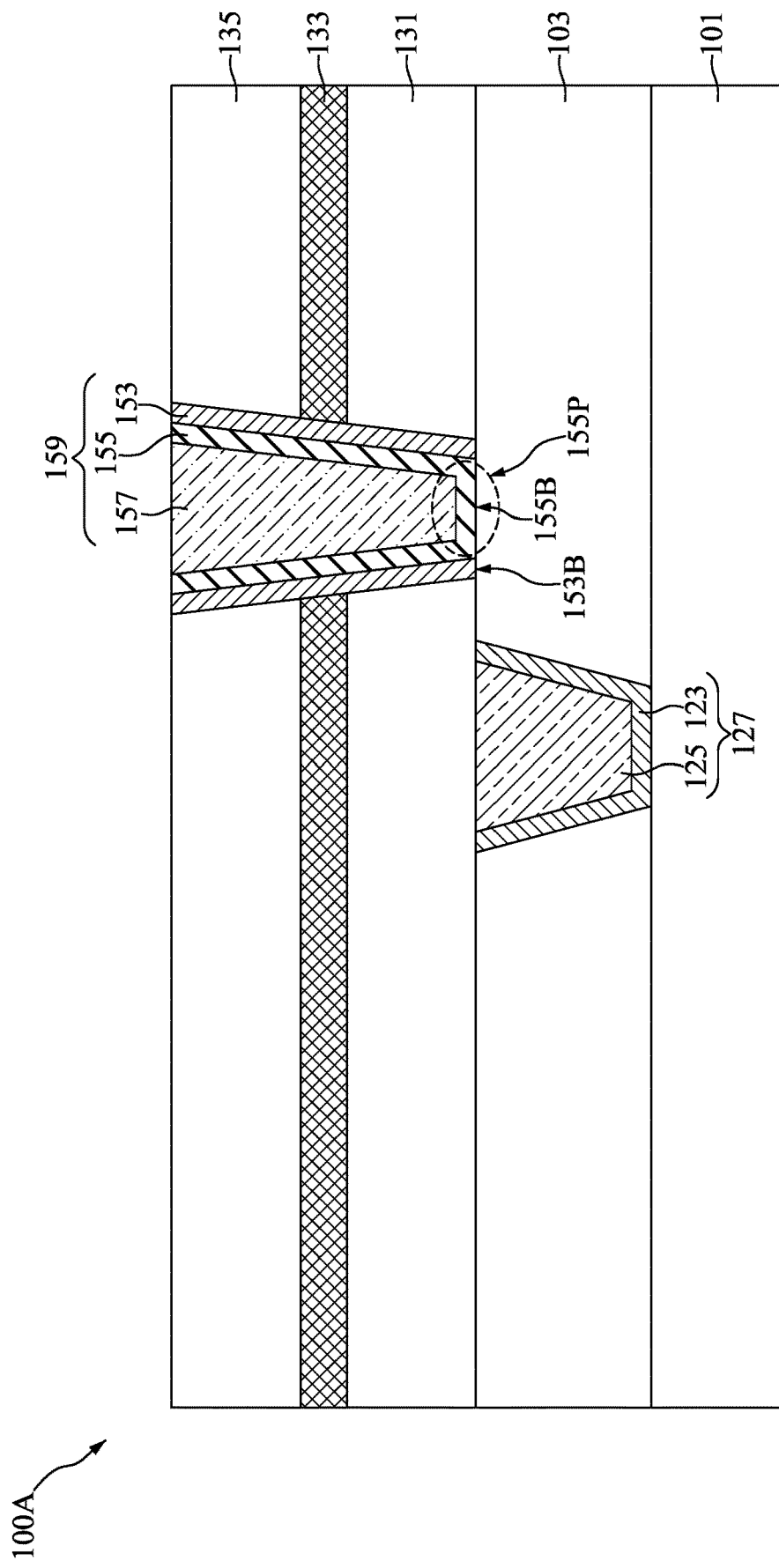
FIG. 1 is a cross-sectional view illustrating a semiconductor device structure according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100A according to various embodiments of the present disclosure. As shown in FIG. 1, the semiconductor device structure 100 includes a first dielectric layer 103 and a conductive via structure 127 (also referred to as a first conductive via structure) disposed over a semiconductor substrate 101, in accordance with some embodiments. In some embodiments, the conductive via structure 127 is surrounded by the first dielectric layer 103. In some embodiments, the conductive via structure 127 penetrates through the first dielectric layer 103 to contact the semiconductor substrate 101.

Moreover, the conductive via structure 127 includes a barrier layer 123 and a conductive layer 125. In some embodiments, the conductive layer 125 is surrounded by the barrier layer 123. In some embodiments, the conductive layer 125 is separated from the first dielectric layer 103 and the semiconductor substrate 101 by the barrier layer 123.

In addition, the semiconductor device structure 100A includes a second dielectric layer 131 disposed over the first dielectric layer 103, a fluorine-catching layer 133 disposed over the second dielectric layer 131, and a third dielectric layer 135 disposed over the fluorine-catching layer 133, in accordance with some embodiments. In some embodiments, the second dielectric layer 131 and the third dielectric layer 135 are separated by the fluorine-catching layer 133.

In some embodiments, the semiconductor device structure 100A includes a conductive via structure 159 (also referred to as a second conductive via structure) disposed over the first dielectric layer 103 and surrounded by the second dielectric layer 131, the fluorine-catching layer 133, and the third dielectric layer 135. In some embodiments, the conductive via structure 159 penetrates through the third dielectric layer 135, the fluorine-catching layer 133, and the second dielectric layer 131 to contact the first dielectric layer 103. In some embodiments, the conductive via structure 159 is in direct contact with the third dielectric layer 135, the fluorine-catching layer 133, and the second dielectric layer 131.

Moreover, the conductive via structure 159 includes an outer barrier layer 153, an inner barrier layer 155, and a conductive layer 157. In some embodiments, the conductive layer 157 is surrounded by the inner barrier layer 155, and the inner barrier layer 155 is surrounded by the outer barrier layer 153. In some embodiments, a portion 155P of the inner barrier layer 155 under the conductive layer 157 is sandwiched between the conductive layer 157 and the first dielectric layer 103. In some embodiments, a bottom surface 155B of the inner barrier layer 155 is substantially level with a bottom surface 153B of the outer barrier layer 153. Within the context of this disclosure, the word "substantially" means preferably at least 90%, more preferably 95%, even more preferably 98%, and most preferably 99%.

In some embodiments, the fluorine-catching layer 133 includes calcium (Ca), such as $CaSiO_2$. In some embodiments, before the conductive via structure 159 is formed, an etching process is performed to form an opening (e.g., the opening 150 shown in FIG. 14) penetrating through the third dielectric layer 135, the fluorine-catching layer 133, and the second dielectric layer 131. In some embodiments, the etching process includes a dry etching process using an etchant including a fluorine-containing gas, and the fluorine-containing gas may react with the fluorine-catching layer 133 to transform at least a portion of the fluorine-catching layer 133 into $CaF_2$, thereby reducing or preventing fluorine contamination to the conductive features (e.g., the conductive via structures 127 and 159) in the semiconductor device structure 100A. As a result, the electrical characteristics of the conductive features will not be affected.

Figure 2:
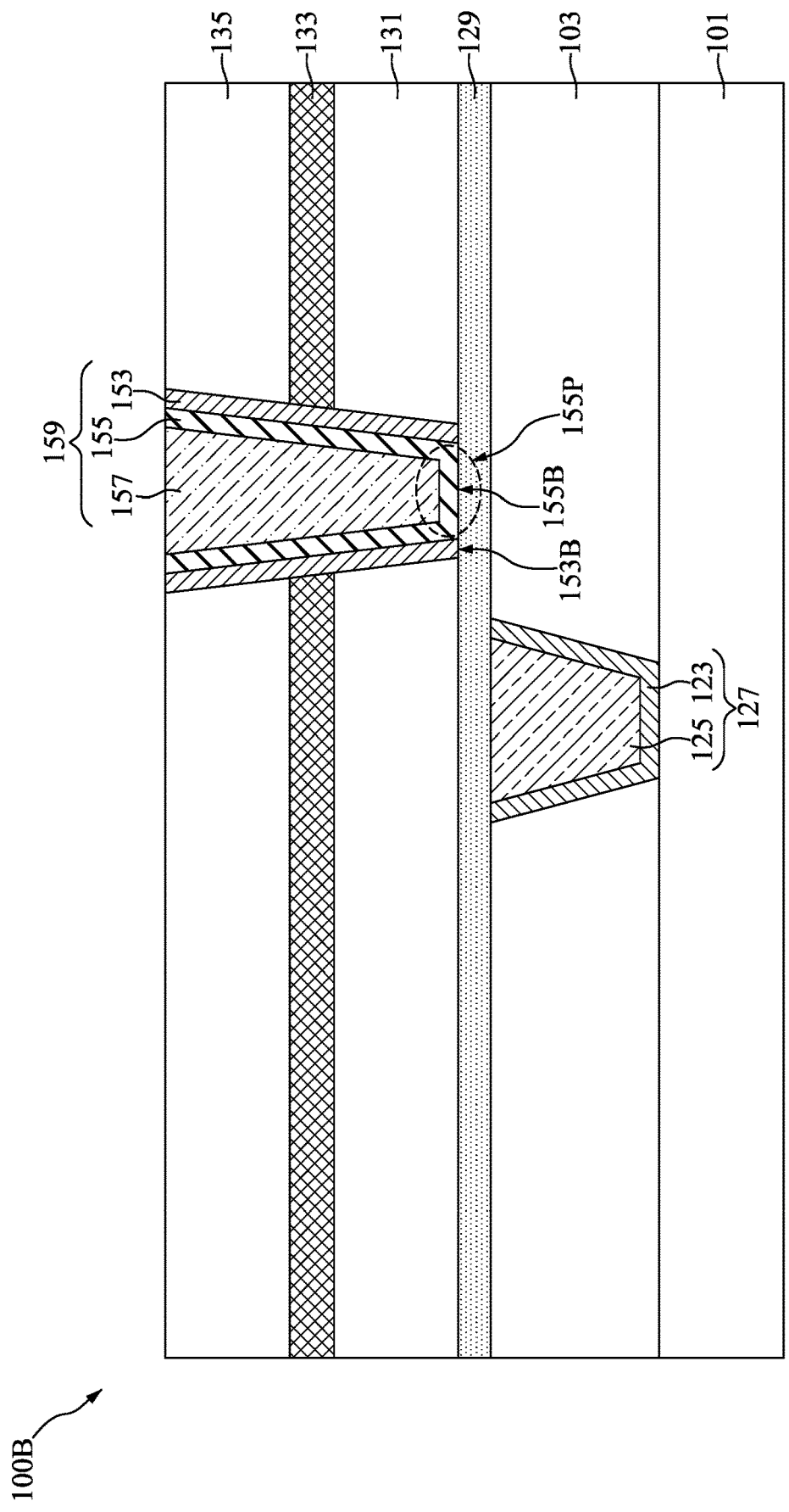
FIG. 2 is a cross-sectional view illustrating a semiconductor device structure according to various embodiments of the present disclosure.

FIG. 2 is a cross-sectional view illustrating a semiconductor device structure 100B according to various embodiments of the present disclosure. The semiconductor device structure 100B is similar to the semiconductor device structure 100A. However, in the semiconductor device structure 100B, an etch stop layer 129 is disposed between the conductive via structures 127 and 159, in accordance with some embodiments.

In some embodiments, the etch stop layer 129 extends continuously between the first dielectric layer 103 and the second dielectric layer 131. In some embodiments, the outer barrier layer 153 and the inner barrier layer 155 of the conductive via structure 159 are in direct contact with the etch stop layer 129. In some embodiments, the etching rate of the etch stop layer 129 is slower than the etching rate of the second dielectric layer 131 during the etching process for forming the opening (e.g., the opening 150 shown in FIG. 14) for the conductive via structure 159.

Figure 3:
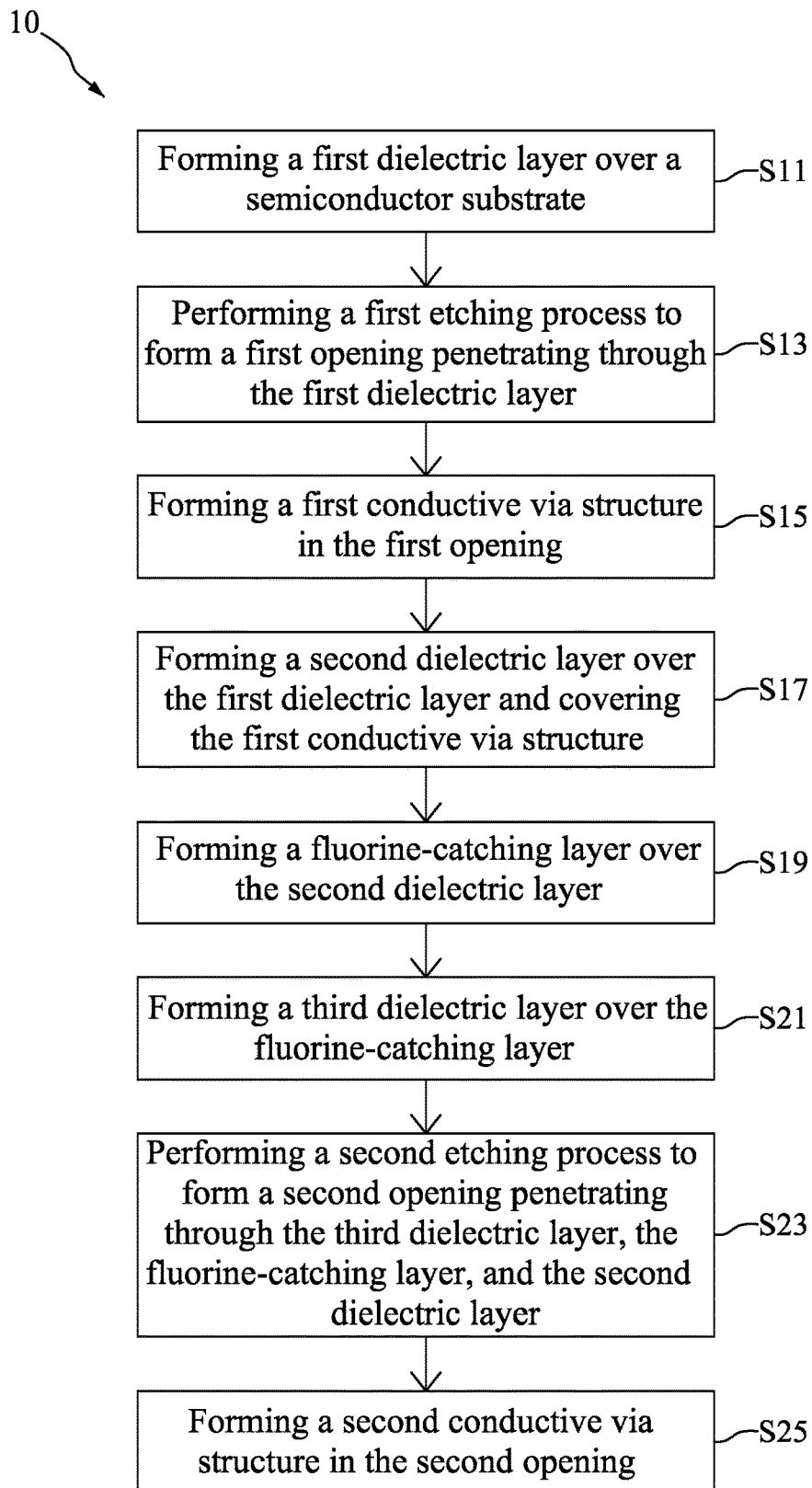
FIG. 3 is a flow diagram illustrating a method for preparing a semiconductor device structure according to various embodiments of the present disclosure.

FIG. 3 is a flow diagram illustrating a method 10 for preparing the semiconductor device structure 100A, and the method 10 includes steps S11, S13, S15, S17, S19, S21, S23 and S25, according to various embodiments of the present disclosure. The steps S11 to S25 of FIG. 3 are elaborated in connection with the following figures, such as FIGS. 5-18.

Figure 4:
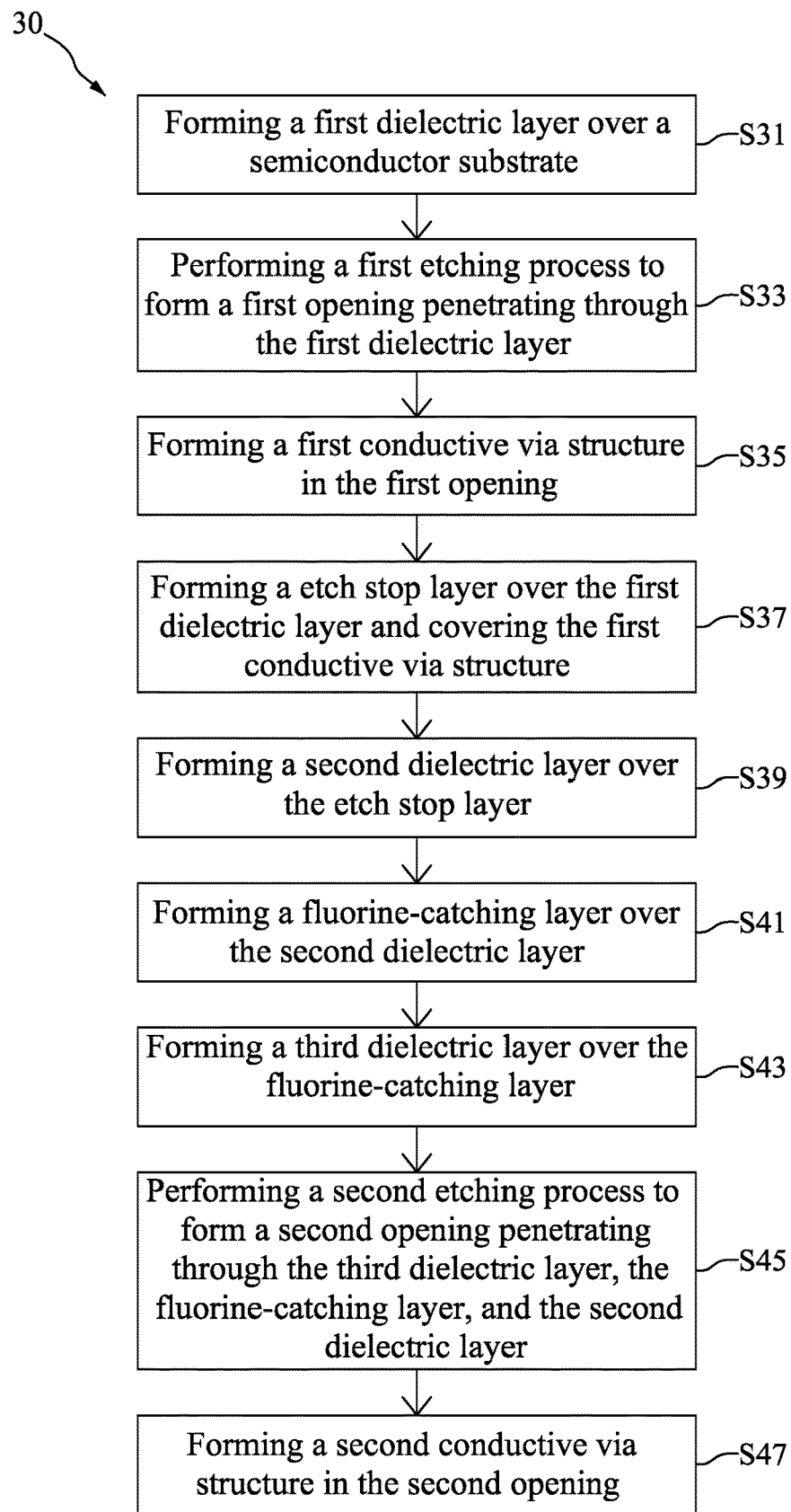
FIG. 4 is a flow diagram illustrating a method for preparing a semiconductor device structure according to various embodiments of the present disclosure.

FIG. 4 is a flow diagram illustrating a method 30 for preparing the semiconductor device structure 100B, and the method 30 includes steps S31, S33, S35, S37, S39, S41, S43, S45 and S47, according to various embodiments of the present disclosure. The steps S31 to S47 of FIG. 4 are elaborated in connection with the following figures, such as FIGS. 19 and 20, and some of the steps are the same as the steps in FIG. 3.

Figure 5:
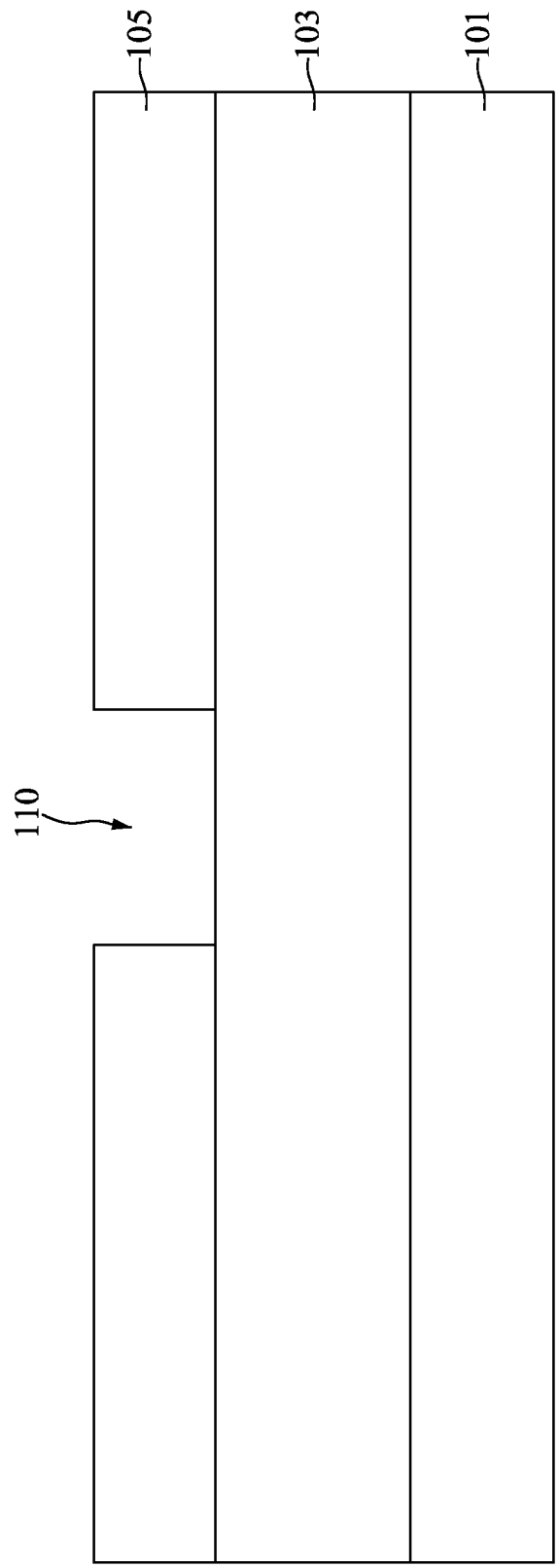
FIG. 5 is a cross-sectional view illustrating an intermediate stage of sequentially forming a first dielectric layer and a patterned mask over a semiconductor substrate during the formation of the semiconductor device structure according to various embodiments of the present disclosure.

FIGS. 5-18 are cross-sectional views illustrating intermediate stages of forming the semiconductor device structure 100A, in accordance with some embodiments. As shown in FIG. 5, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A first dielectric layer 103 is formed over the semiconductor substrate 101, as shown in FIG. 5 in accordance with some embodiments. The respective step is illustrated as the step S11 in the method 10 shown in FIG. 3. In some embodiments, the first dielectric layer 103 is made of silicon oxide, silicon nitride, silicon oxynitride, a low-k dielectric material or another suitable material. The first dielectric layer 103 may be formed by a deposition process, such as a chemical vapor deposition (CVD) process, a physical vapor deposition (PVD) process, an atomic layer deposition (ALD) process, a spin-on coating process, or another suitable method.

Then, still referring to FIG. 5, a patterned mask 105 with an opening 110 is formed over the first dielectric layer 103. In some embodiments, the first dielectric layer 103 is partially exposed by the opening 110. In some embodiments, the first dielectric layer 103 and the patterned mask 105 include different materials so that the etching selectivities may be different in the subsequent etching process.

Figure 6:
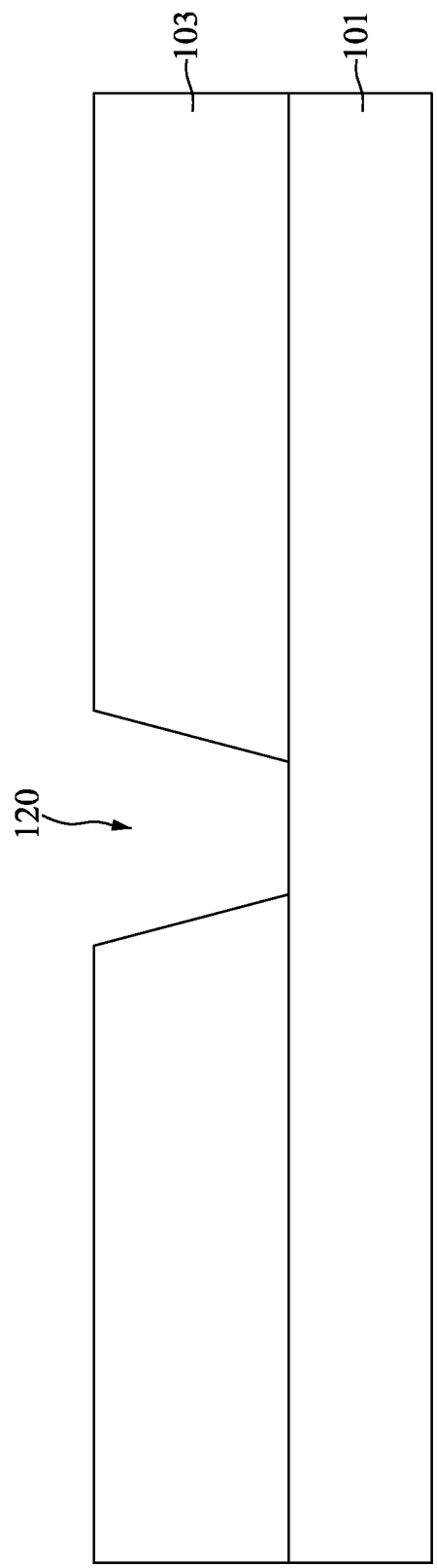
FIG. 6 is a cross-sectional view illustrating an intermediate stage of etching the first dielectric layer to form a first opening using the patterned mask as a mask during the formation of the semiconductor device structure according to various embodiments of the present disclosure.

Subsequently, an etching process (also referred to as a first etching process) is performed on the first dielectric layer 103 using the patterned mask 105 as a mask, such that a first opening 120 is formed in the first dielectric layer 103, as shown in FIG. 6 in accordance with some embodiments. In some embodiments, the first opening 120 penetrates through the first dielectric layer 103, such that the semiconductor substrate 101 is partially exposed. The respective step is illustrated as the step S13 in the method 10 shown in FIG. 3. The etching process may be a wet etching process, a dry etching process, and a combination thereof.

In some embodiments, the first opening 120 has a tapered width, such that a width of the first opening 120 gradually decreases from a top surface of the first dielectric layer 103 to the exposed portion of the semiconductor substrate 101. After the first opening 120 is formed, the patterned mask 105 may be removed. In some embodiments, the patterned mask 105 is removed by a stripping process, an ashing process, an etching process, or another suitable process.

Figure 7:
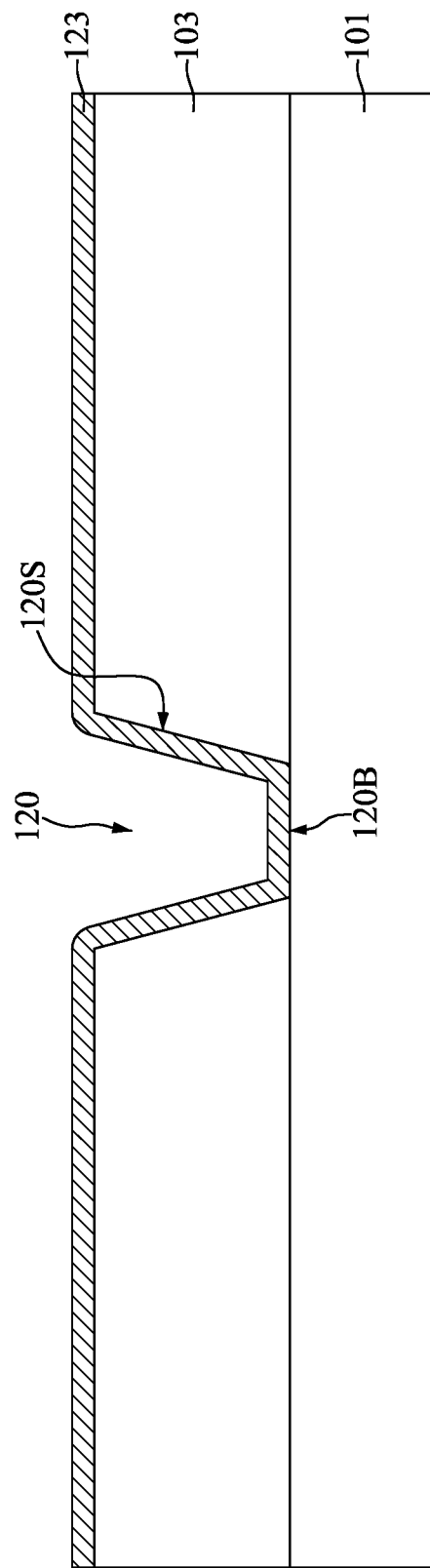
FIG. 7 is a cross-sectional view illustrating an intermediate stage of forming a barrier layer lining the first opening and covering the first dielectric layer during the formation of the semiconductor device structure according to various embodiments of the present disclosure.

Next, a barrier layer 123 is formed lining the first opening 120 and over the first dielectric layer 103, as shown in FIG. 7 in accordance with some embodiments. In some embodiments, the barrier layer 123 is formed covering the sidewalls 120S and the bottom surface 120B of the first opening 120. In some embodiments, the barrier layer 123 includes tantalum nitride (TaN). However, any other suitable materials, such as titanium (Ti), titanium nitride (TiN), tantalum (Ta), cobalt tungsten (CoW), may be utilized. Moreover, the barrier layer 123 may be formed by a deposition process, such as a CVD process, a PVD process, an ALD process, a metal organic chemical vapor deposition (MOCVD) process, a sputtering process, a plating process, or another suitable process.

Figure 8:
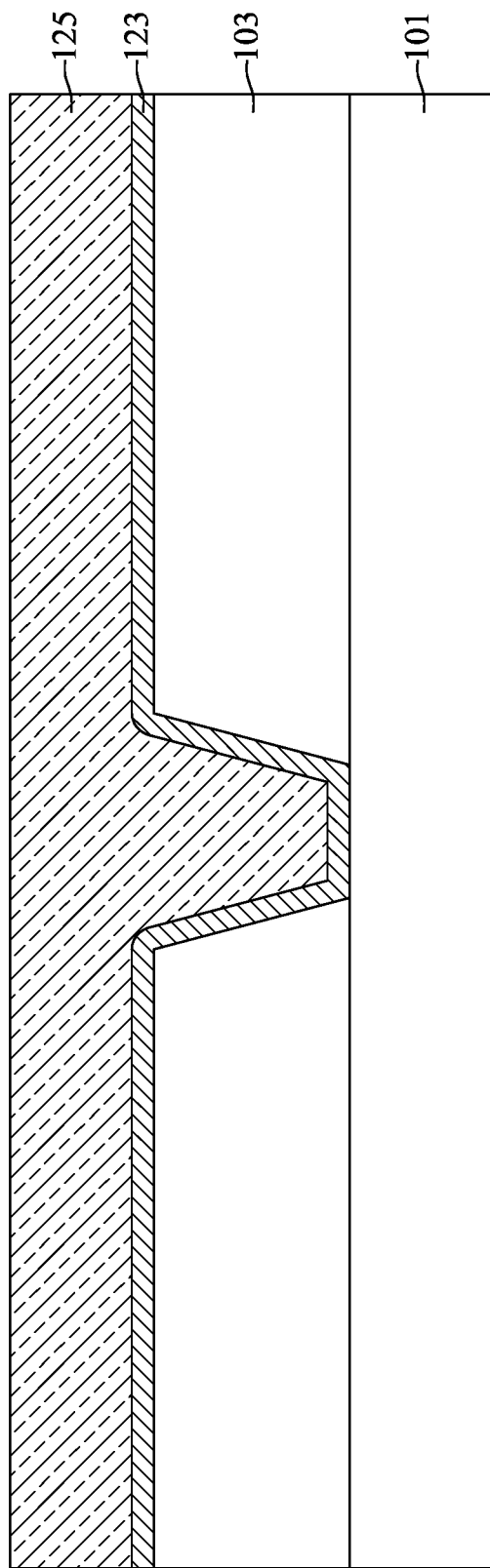
FIG. 8 is a cross-sectional view illustrating an intermediate stage of forming a conductive layer in the first opening and covering the barrier layer during the formation of the semiconductor device structure according to various embodiments of the present disclosure.
Figure 9:
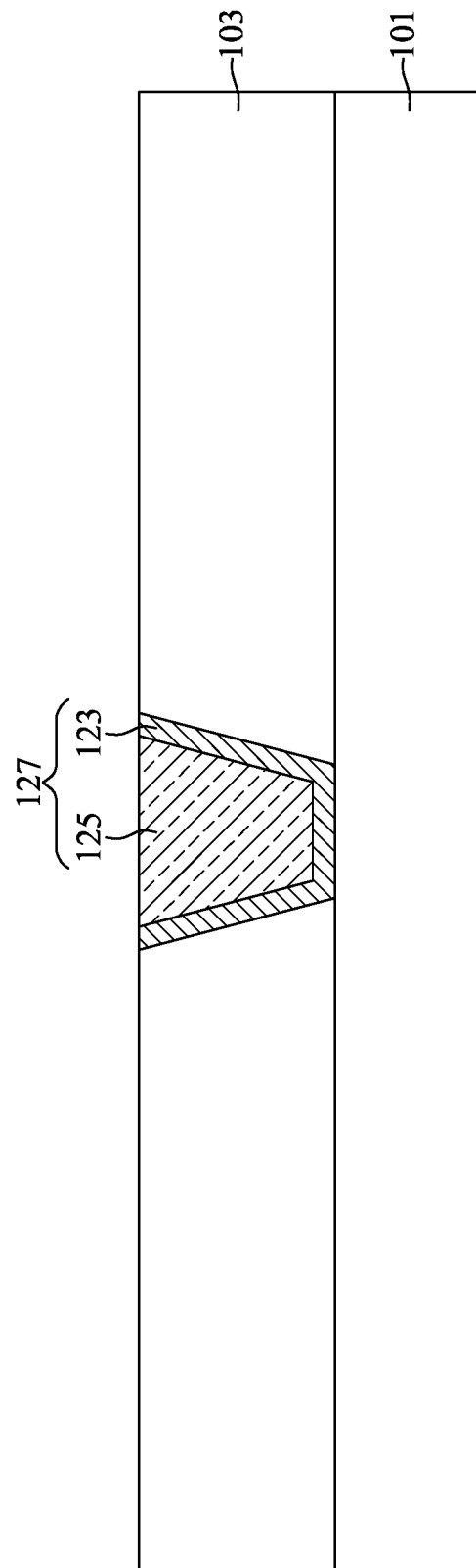
FIG. 9 is a cross-sectional view illustrating an intermediate stage of performing a planarization process to form a conductive via structure in the first opening during the formation of the semiconductor device structure according to various embodiments of the present disclosure.

Then, a conductive layer 125 is formed over the barrier layer 123 and filling a remaining portion of the first opening 120, as shown in FIG. 8 in accordance with some embodiments. In some embodiments, the conductive layer 125 includes copper (Cu). However, any other suitable materials, such as aluminum (Al), tungsten (W), titanium (Ti), tantalum (Ta), gold (Au), silver (Ag), may be utilized. Some processes used to form the conductive layer 125 are similar to, or the same as those used to form the barrier layer 123 and details thereof are not repeated herein.

Figure 10:
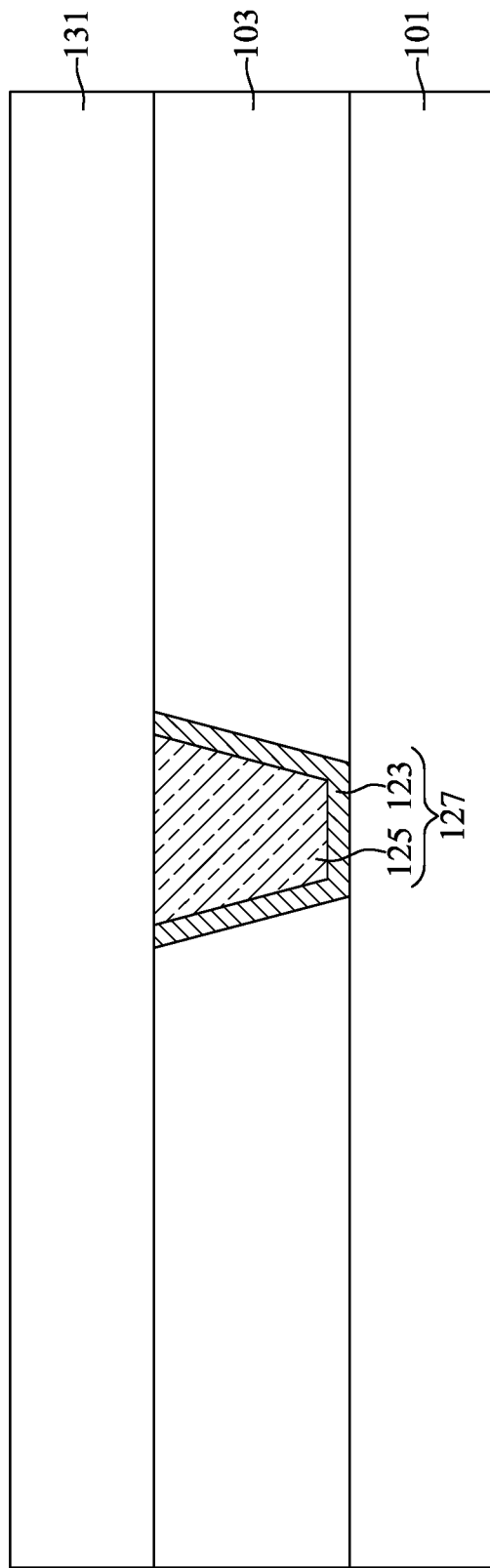
FIG. 10 is a cross-sectional view illustrating an intermediate stage of forming a second dielectric layer over the first dielectric layer during the formation of the semiconductor device structure according to various embodiments of the present disclosure.

Subsequently, a planarization process is performed on the barrier layer 123 and the conductive layer 125 until the first dielectric layer 103 is exposed, as shown in FIG. 10 in accordance with some embodiments. After the planarization process is performed, remaining portions of the barrier layer 123 and the conductive layer 125 form a conductive via structure 127. The planarization process may include a chemical mechanical polishing (CMP) process. The respective step is illustrated as the step S15 in the method 10 shown in FIG. 3.

Next, a second dielectric layer 131 is formed over the first dielectric layer 103 and covering the conductive via structure 127, as shown in FIG. 10 in accordance with some embodiments. The respective step is illustrated as the step S17 in the method 10 shown in FIG. 3. Some materials and processes used to form the second dielectric layer 131 are similar to, or the same as those used to form the first dielectric layer 103 and details thereof are not repeated herein. In the present embodiment, the first dielectric layer 103 and the second dielectric layer 131 include different materials so that the etching selectivities may be different in the subsequent etching process.

Figure 11:
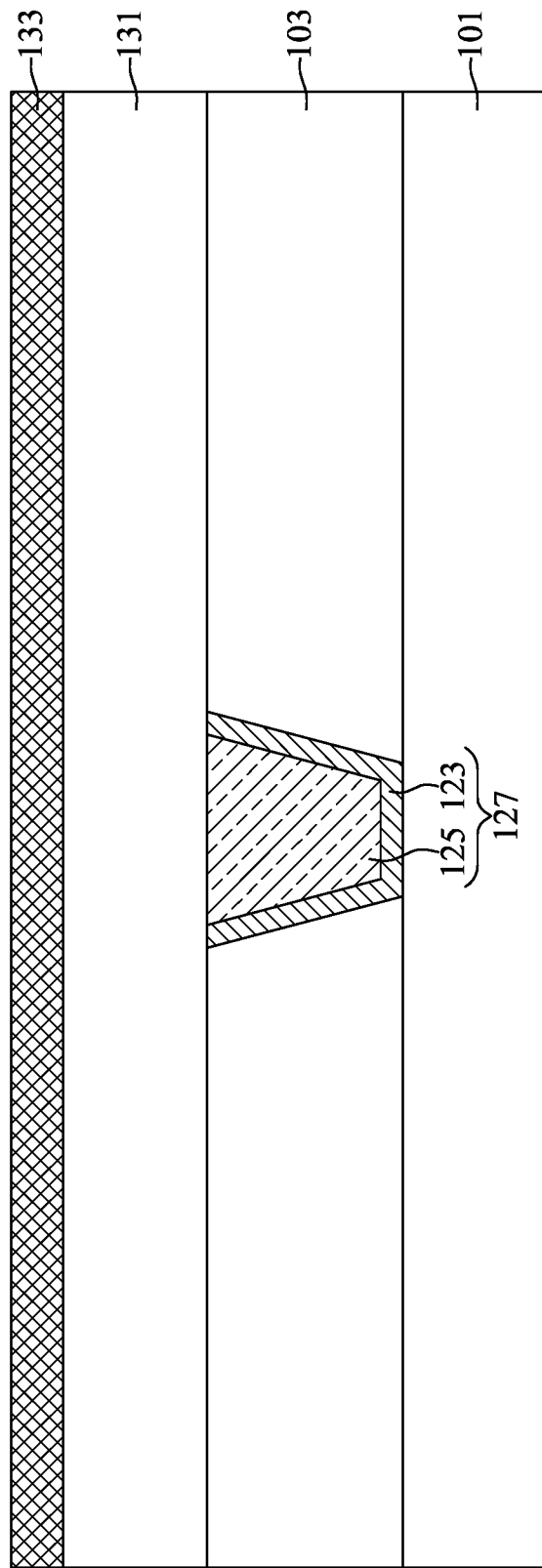
FIG. 11 is a cross-sectional view illustrating an intermediate stage of forming a fluorine-catching layer over the second dielectric layer during the formation of the semiconductor device structure according to various embodiments of the present disclosure.

Then, a fluorine-catching layer 133 is formed over the second dielectric layer 131, as shown in FIG. 11 in accordance with some embodiments. The respective step is illustrated as the step S19 in the method 10 shown in FIG. 3. In some embodiments, the fluorine-catching layer 133 includes calcium (Ca). In some embodiments, the fluorine-catching layer 133 includes $CaSiO_2$. In some embodiments, the fluorine-catching layer 133 is formed by a deposition process, such as a CVD process, a PVD process, an ALD process, a spin-on coating process, or another suitable method.

Figure 12:
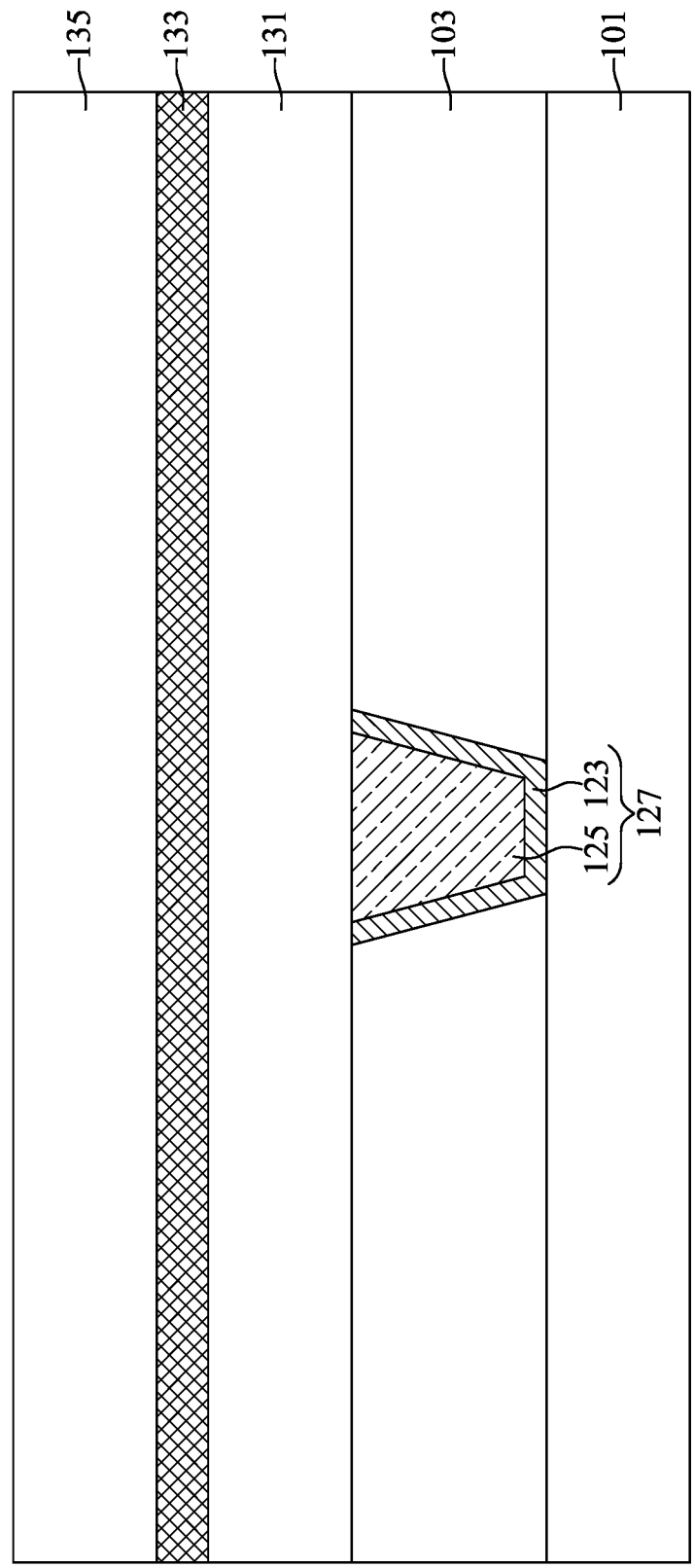
FIG. 12 is a cross-sectional view illustrating an intermediate stage of forming a third dielectric layer over the fluorine-catching layer during the formation of the semiconductor device structure according to various embodiments of the present disclosure.

Subsequently, a third dielectric layer 135 is formed over the fluorine-catching layer 133, as shown in FIG. 12 in accordance with some embodiments. The respective step is illustrated as the step S21 in the method 10 shown in FIG. 3. Some materials and processes used to form the third dielectric layer 135 are similar to, or the same as those used to form the first dielectric layer 103 and details thereof are not repeated herein.

Figure 13:
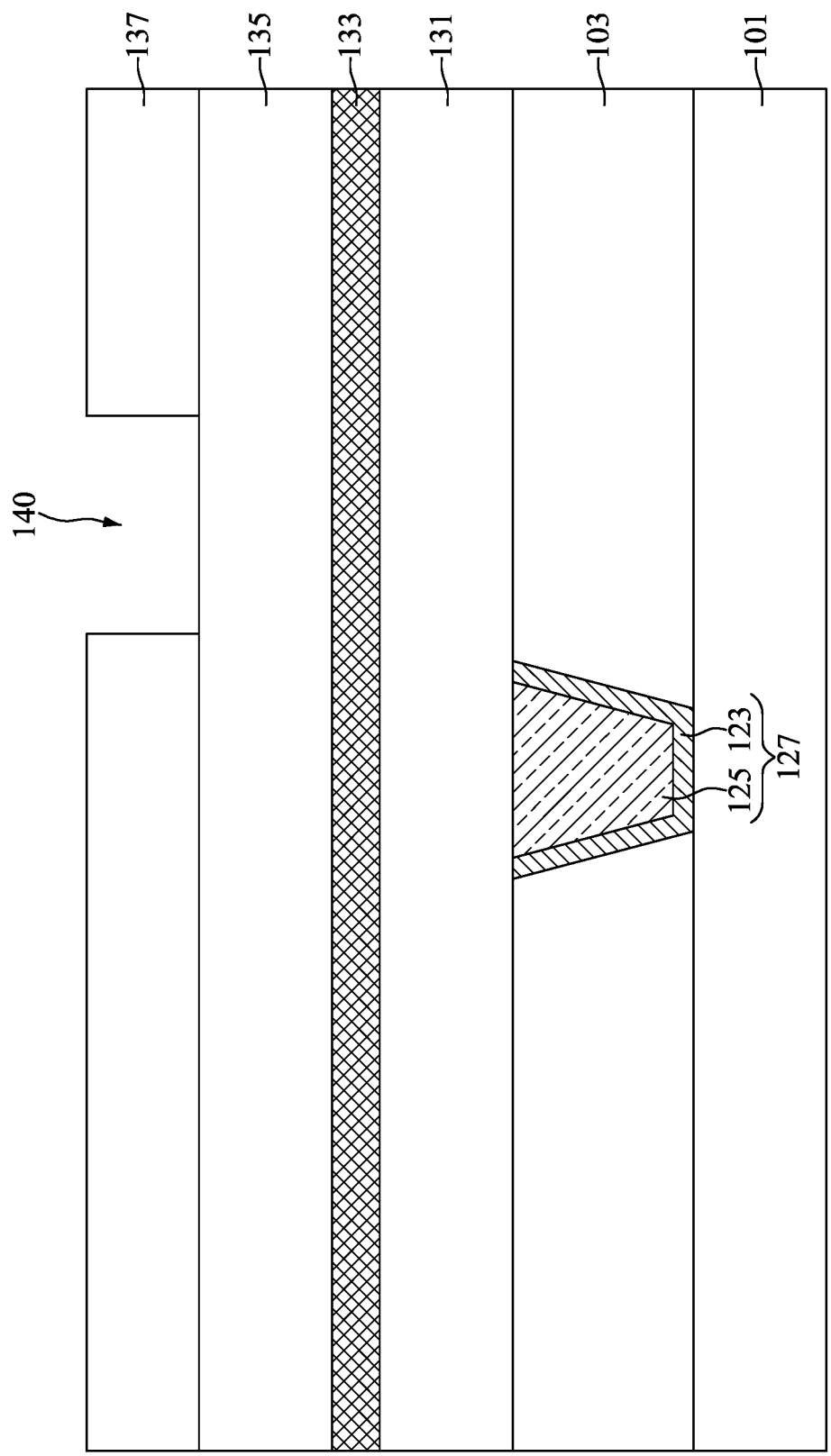
FIG. 13 is a cross-sectional view illustrating an intermediate stage of forming a patterned mask over the third dielectric layer during the formation of the semiconductor device structure according to various embodiments of the present disclosure.

Next, a patterned mask 137 with an opening 140 is formed over the third dielectric layer, as shown in FIG. 13 in accordance with some embodiments. In some embodiments, the third dielectric layer 135 is partially exposed by the opening 140. In some embodiments, the first dielectric layer 103 and the patterned mask 137 include different materials so that the etching selectivities may be different in the subsequent etching process.

Figure 14:
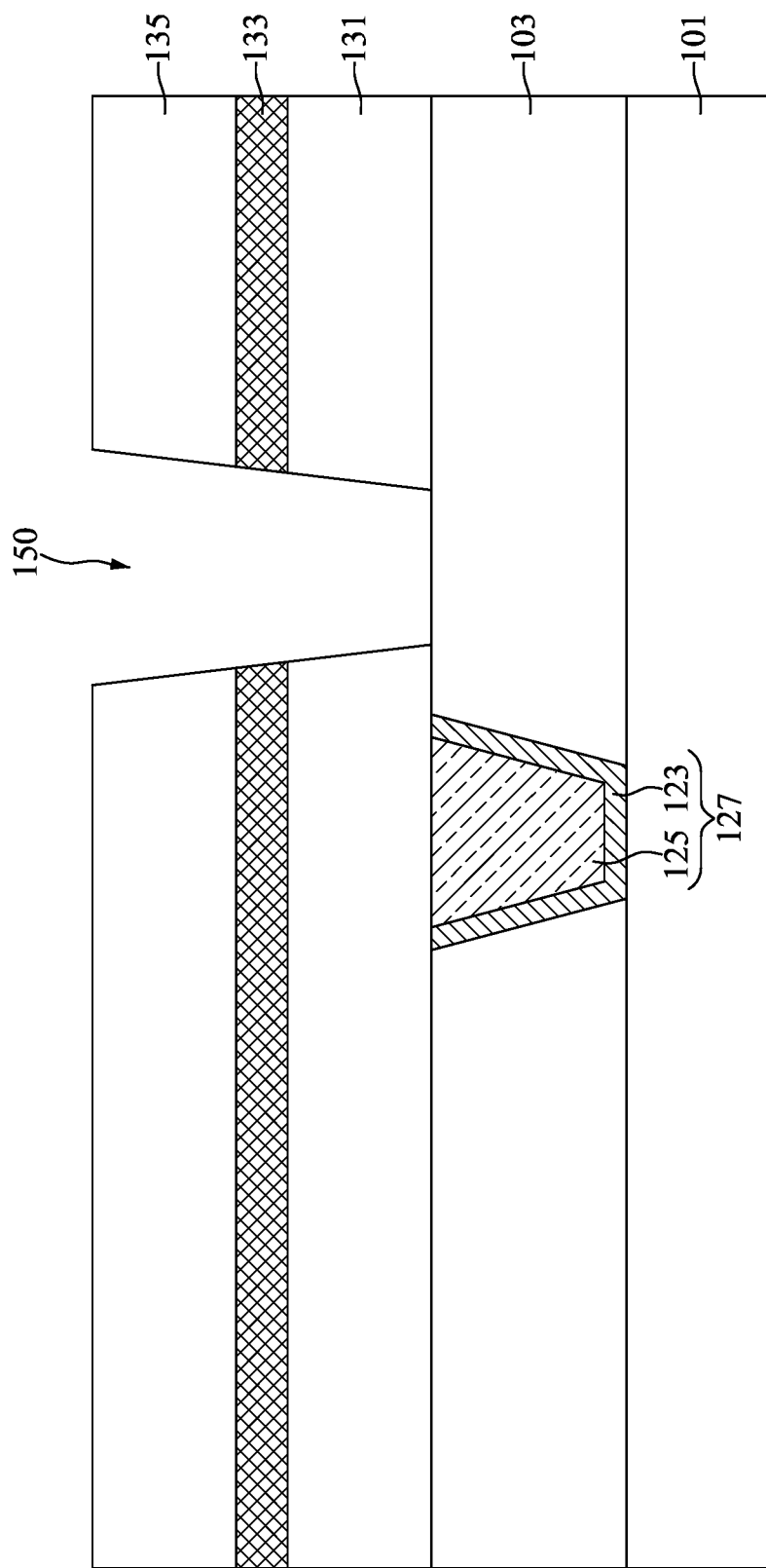
FIG. 14 is a cross-sectional view illustrating an intermediate stage of performing an etching process to form a second opening using the patterned mask as a mask during the formation of the semiconductor device structure according to various embodiments of the present disclosure.

Then, an etching process (also referred to as a second etching process) is performed on the second dielectric layer 131, the fluorine-catching layer 133 and the third dielectric layer 135 using the patterned mask 137 as a mask, such that a second opening 150 is formed, as shown in FIG. 14 in accordance with some embodiments. In some embodiments, the second opening 150 penetrates through the third dielectric layer 135, the fluorine-catching layer 133, and the second dielectric layer 131, such that the first dielectric layer 103 is partially exposed. The respective step is illustrated as the step S23 in the method 10 shown in FIG. 3.

In some embodiments, the etching process for forming the opening 150 includes a dry etching process using an etchant including a fluorine-containing gas. For example, a dry etching process using $CHF_3$ or $BF_3$ as an etchant may be used. In some embodiments, the fluorine-containing gas reacts with the fluorine-catching layer 133 to transform at least a portion of the fluorine-catching layer 133 into $CaF_2$. In some embodiments, after the etching process for forming the opening 150, the fluorine-catching layer 133 includes $CaSiO_2$, $CaF_2$, or a combination thereof.

In some embodiments, the second opening 150 has a tapered width, such that a width of the second opening 150 gradually decreases from a top surface of the third dielectric layer 135 to the exposed surface of the first dielectric layer 103. After the second opening 150 is formed, the patterned mask 137 may be removed. In some embodiments, the patterned mask 137 is removed by a stripping process, an ashing process, an etching process, or another suitable process.

Figure 15:
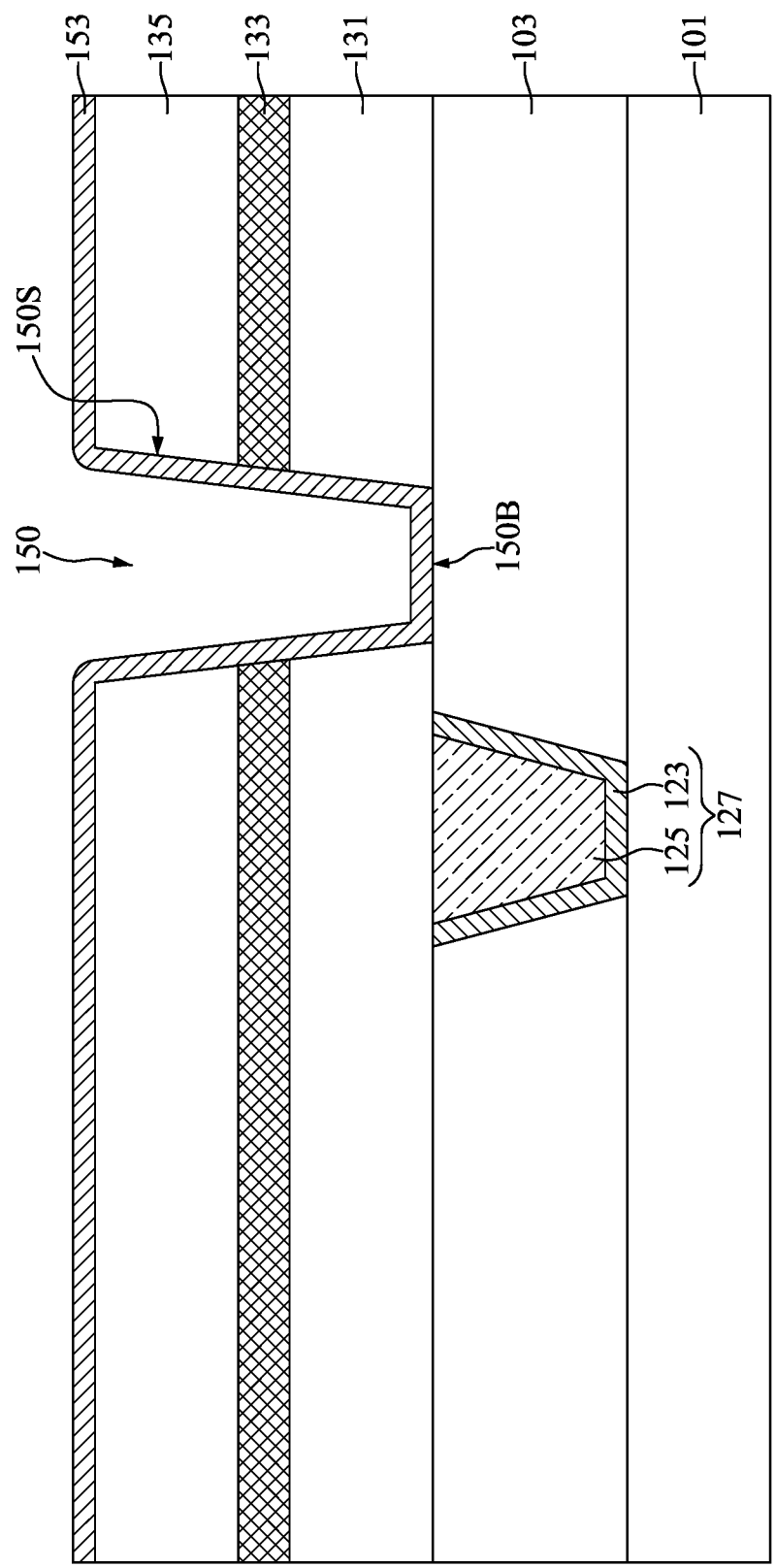
FIG. 15 is a cross-sectional view illustrating an intermediate stage of forming an outer barrier layer lining the second opening and covering the third dielectric layer during the formation of the semiconductor device structure according to various embodiments of the present disclosure.
Figure 16:
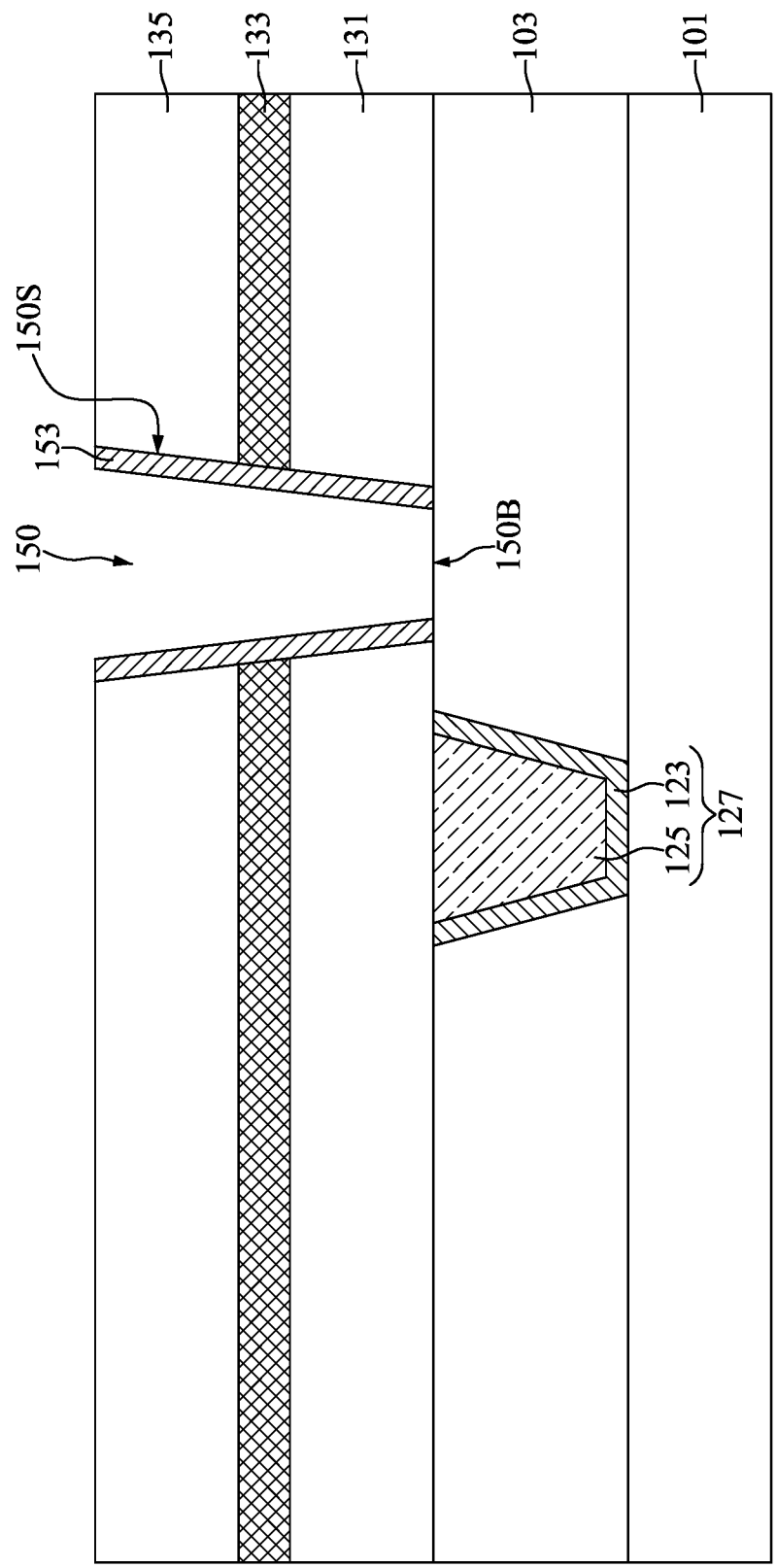
FIG. 16 is a cross-sectional view illustrating an intermediate stage of partially removing the outer barrier layer during the formation of the semiconductor device structure according to various embodiments of the present disclosure.

Subsequently, an outer barrier layer 153 is formed lining the second opening 150 and over the third dielectric layer 135, as shown in FIG. 15 in accordance with some embodiments. In some embodiments, the outer barrier layer 153 is formed covering the sidewalls 150S and the bottom surface 150B of the second opening 150. In some embodiments, the outer barrier layer 153 includes tantalum nitride (TaN). However, any other suitable materials, such as titanium (Ti), titanium nitride (TiN), tantalum (Ta), cobalt tungsten (CoW), may be utilized. Some processes used to form the outer barrier layer 153 are similar to, or the same as those used to form the barrier layer 123 of the previously formed conductive via structure 127 and details thereof are not repeated herein.

Next, an anisotropic etching process is performed to remove horizontal portions of the outer barrier layer 153, leaving vertical portions of the outer barrier layer 153. In some embodiments, after the anisotropic etching process is performed, the sidewalls 150S of the second opening 150 remain covered by the outer barrier layer 153, while the first dielectric layer 103 exposed by the bottom surface 150B of the second opening 150. Moreover, the third dielectric layer 135 is exposed after the anisotropic etching process, in accordance with some embodiments.

In addition, in some embodiments, the anisotropic etching process includes a dry etching process using an etchant including a fluorine-containing gas. For example, a dry etching process using $CHF_3$ or $BF_3$ as an etchant may be used. In some embodiments, the fluorine-containing gas reacts with the fluorine-catching layer 133, which includes $CaSiO_2$, to transform at least a portion of the fluorine-catching layer 133 into $CaF_2$.

In some embodiments, the fluorine content of the fluorine-catching layer 133 is increased after the anisotropic etching process for the outer barrier layer 153 is performed. In other words, the fluorine-catching layer 133 has a first fluorine content before the outer barrier layer 153 is formed, the fluorine-catching layer 133 has a second fluorine content after the partially removal of the outer barrier layer 153, and the second fluorine content is greater than the first fluorine content, in accordance with some embodiments.

Figure 17:
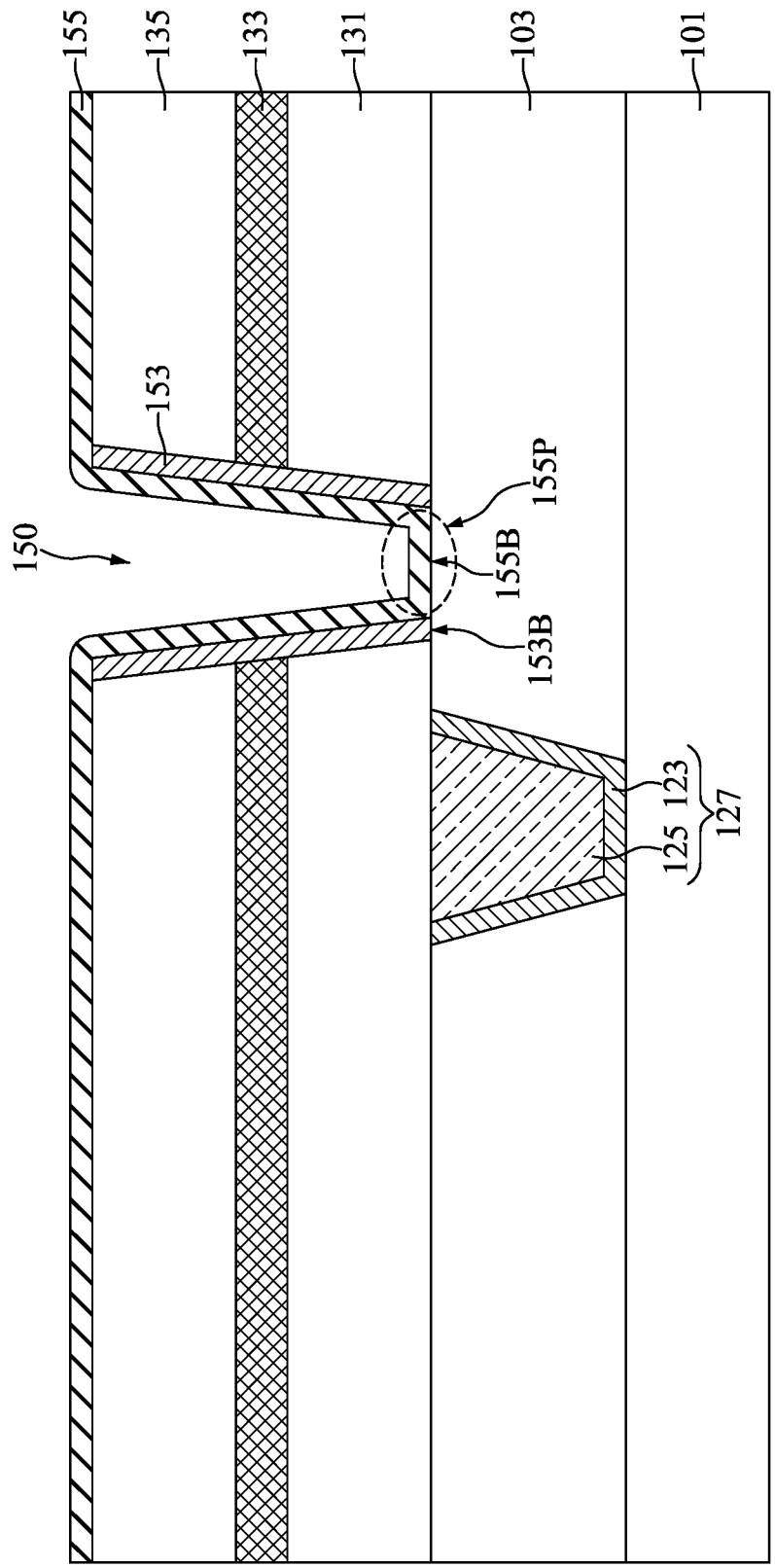
FIG. 17 is a cross-sectional view illustrating an intermediate stage of forming an inner barrier layer in the second opening and covering the outer barrier layer and the third dielectric layer during the formation of the semiconductor device structure according to various embodiments of the present disclosure.

Then, an inner barrier layer 155 is formed over the outer barrier layer 153, as shown in FIG. 17 in accordance with some embodiments. In some embodiments, the inner barrier layer 155 is formed lining the second opening 150 and extending over the third dielectric layer 135. Moreover, a portion 155P of the inner barrier layer 155 is formed covering the bottom surface 150B of the second opening (see FIG. 16) and in direct contact with the first dielectric layer 103, in accordance with some embodiments. In some embodiments, the bottom surface 155B of the inner barrier layer 155 is substantially level with the bottom surface 153B of the outer barrier layer 153.

In some embodiments, the inner barrier layer 155 includes CuBS (Endura CuBS, copper barrier/seed). However, any other suitable materials, such as titanium (Ti), titanium nitride (TiN), tantalum (Ta), tantalum nitride (TaN), cobalt tungsten (CoW), may be utilized. Some processes used to form the inner barrier layer 155 are similar to, or the same as those used to form the barrier layer 123 of the previously formed conductive via structure 127 and details thereof are not repeated herein.

Figure 18:
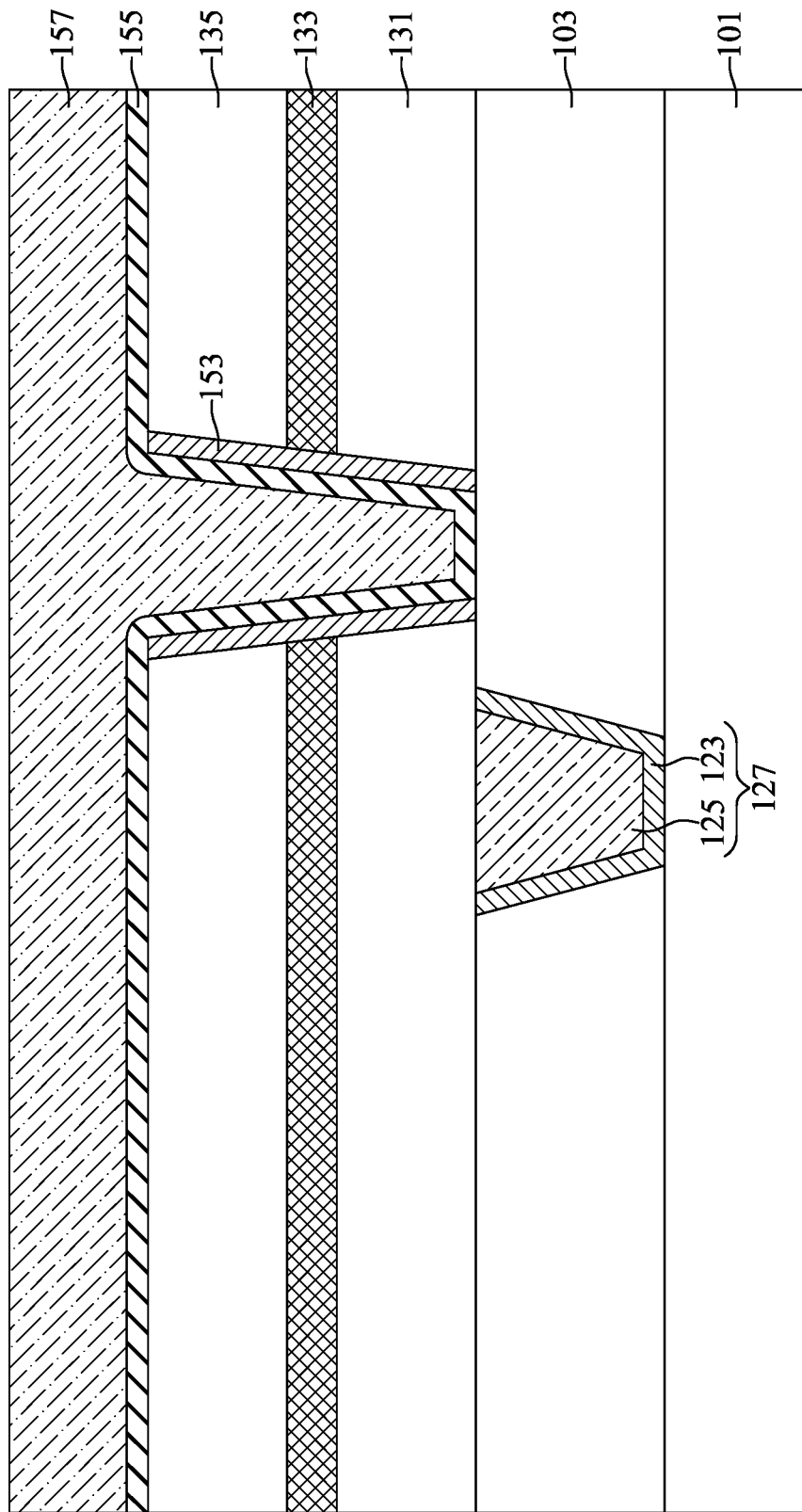
FIG. 18 is a cross-sectional view illustrating an intermediate stage of forming a conductive layer in the second opening and covering the outer barrier layer during the formation of the semiconductor device structure according to various embodiments of the present disclosure.

Subsequently, a conductive layer 157 is formed over the inner barrier layer 155 and filling a remaining portion of the second opening 150, as shown in FIG. 18 in accordance with some embodiments. In some embodiments, the conductive layer 157 is separated from the first dielectric layer 103, the second dielectric layer 131, the fluorine-catching layer 133, and the third dielectric layer 135 by the outer barrier layer 153 and the inner barrier layer 155. In some embodiments, the conductive layer 157 includes copper (Cu). However, any other suitable materials, such as aluminum (Al), tungsten (W), titanium (Ti), tantalum (Ta), gold (Au), silver (Ag), may be utilized. Some processes used to form the conductive layer 157 are similar to, or the same as those used to form barrier layer 123 of the previously formed conductive via structure 127 and details thereof are not repeated herein.

Next, a planarization process is performed on the inner barrier layer 155 and the conductive layer 157 until the third dielectric layer 135 is exposed, as shown in FIG. 1 in accordance with some embodiments. After the planarization process is performed, the outer barrier layer 153, the inner barrier layer 155, and the conductive layer 157 form a conductive via structure 159, and the semiconductor device structure 100A is obtained. The respective step is illustrated as the step S25 in the method 10 shown in FIG. 3. The planarization process may include a CMP process.

As mentioned above, one or more etching processes performed during the formation of the conductive via structure 159 include dry etching using fluorine-containing gas. Since the fluorine-catching layer 133 includes calcium (Ca), such as $CaSiO_2$, the fluorine-containing gas may react with the fluorine-catching layer 133 to transform at least a portion of the fluorine-catching layer 133 into $CaF_2$, thereby reducing or preventing fluorine contamination to the conductive via structures 127 and 159 in the semiconductor device structure 100A, such that the electrical characteristics of the conductive via structures 127 and 159 will not be affected. As a result, the performance, reliability and yield of the semiconductor device structure can be improved.

Figure 19:
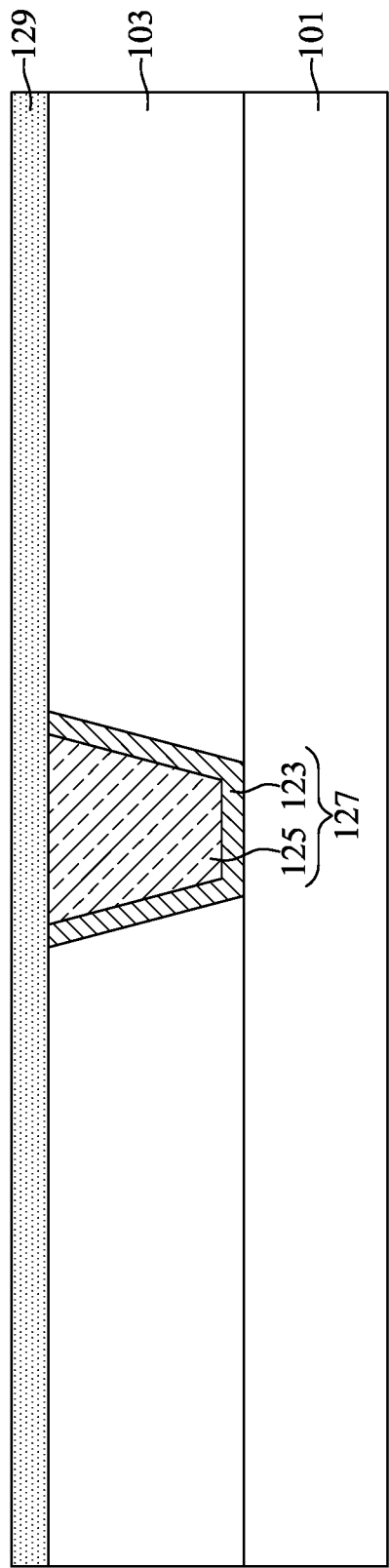
FIG. 19 is a cross-sectional view illustrating an intermediate stage of forming an etch stop layer over the first dielectric layer during the formation of the semiconductor device structure according to various embodiments of the present disclosure.
Figure 20:
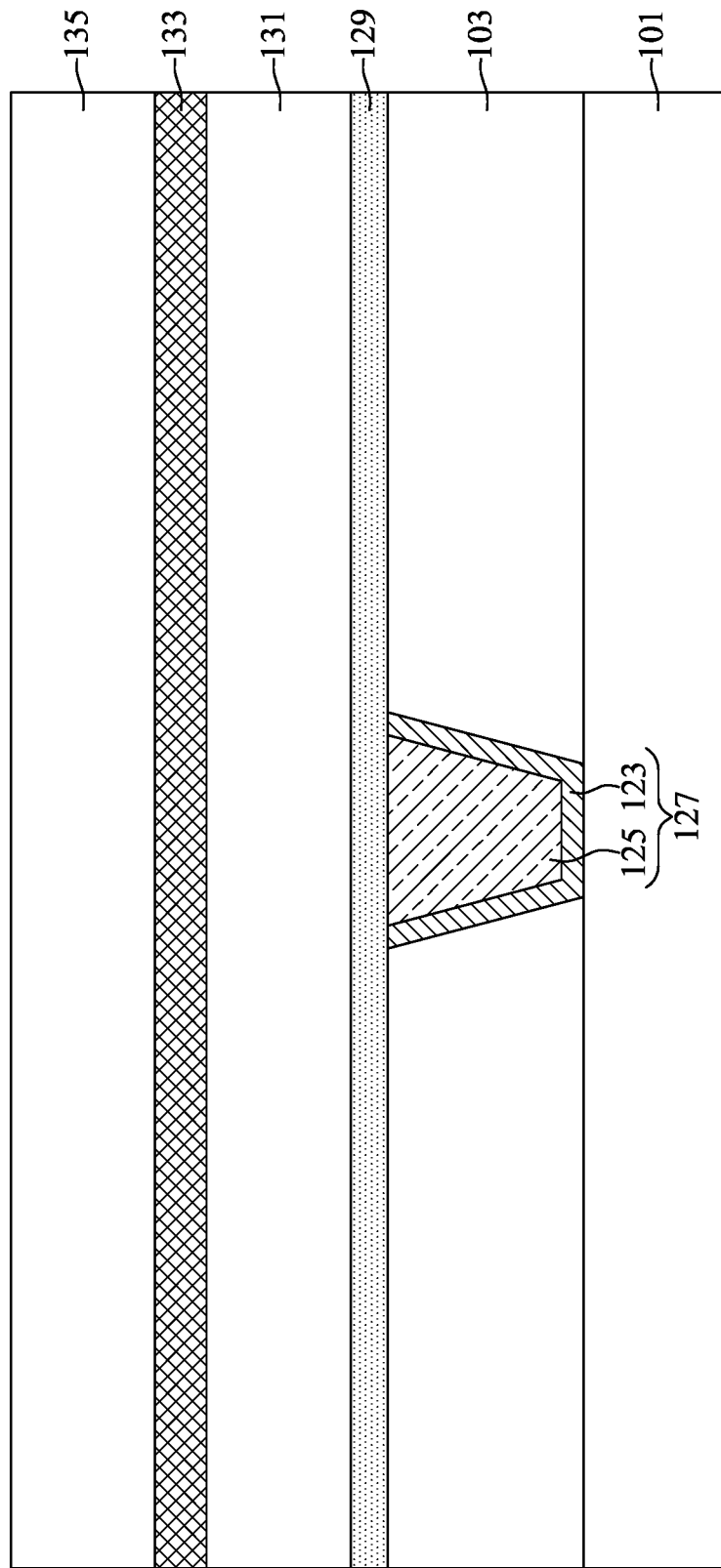
FIG. 20 is a cross-sectional view illustrating an intermediate stage of sequentially forming a second dielectric layer, a fluorine-catching layer, and a third dielectric layer over the etch stop layer during the formation of the semiconductor device structure according to various embodiments of the present disclosure.

FIGS. 19 and 20 are cross-sectional views illustrating intermediate stages of forming the semiconductor device structure 100B in FIG. 2, in accordance with some embodiments. It should be pointed out that operations for forming the semiconductor device structure 100B before the structure shown in FIG. 19 are substantially the same as the operations for forming the semiconductor device structure 100A shown in FIGS. 5-9 (The steps S31, S33 and S35 in the method 30 shown in FIG. 4 is the same as the steps S11, S13 and S15 in the method 10 shown in FIG. 3), and the related detailed descriptions may refer to the foregoing paragraphs and are not discussed again herein.

After the conductive via structure 127 is formed in the first dielectric layer 103, an etch stop layer 129 is formed over the first dielectric layer 103 and covering the conductive via structure 127, as shown in FIG. 19 in accordance with some embodiments. The respective step is illustrated as the step S37 in the method 30 shown in FIG. 4. In some embodiments, the etch stop layer 129 is made of silicon oxide, silicon nitride, silicon oxynitride, silicon carbide, carbon nitride, or a combination thereof. The etch stop layer 129 may be formed by a deposition process, such as a CVD process, a plasma enhanced CVD (PECVD) process, a spin-on coating process, or another suitable method.

Then, a second dielectric layer 131, a fluorine-catching layer 133, and a third dielectric layer 135 are sequentially formed over the etch stop layer 129, as shown in FIG. 20 in accordance with some embodiments. The respective steps are illustrated as the steps S39, S41 and S43 in the method 30 shown in FIG. 4. The steps S39, S41 and S43 in the method 30 shown in FIG. 4 are the same as the steps S17, S19 and S21 in the method 10 shown in FIG. 3, and the detailed descriptions are not repeated herein.

In some embodiments, the material of the etch stop layer 129 is selected to have a high etch selectivity compared to the second dielectric layer 131 in the subsequent etching process. For example, the second dielectric layer 131 may be silicon dioxide ($SiO_2$), and the etch stop layer 129 may be silicon nitride, silicon carbide, silicon oxynitride, or silicon carbon nitride, which each have a high etch selectivity compared to $SiO_2$.

After the third dielectric layer 135 is formed, an etching process is performed to form a second opening (not shown) penetrating through the third dielectric layer 135, the fluorine-catching layer 133, and the second dielectric layer 131, and a conductive via structure 159 including an outer barrier layer 153, an inner barrier layer 155 and a conductive layer 157 is formed in the second opening, as shown in FIG. 2 in accordance with some embodiments. The respective steps are illustrated as the steps S45 and S47 in the method 30 shown in FIG. 4.

The steps S45 and S47 in the method 30 shown in FIG. 4 are the same as the steps S23 and S25 in the method 10 shown in FIG. 3, and the detailed descriptions are not repeated herein. In addition, the etching process for the second opening is performed until the etch stop layer 129 is exposed, such that the subsequently formed conductive via structure 159 is formed over and in direct contact with the etch stop layer 129, in accordance with some embodiments.

After the conductive via structure 159 is formed, the semiconductor device structure 100B is obtained. In some embodiments, the conductive via structure 159 is separated from the first dielectric layer 103 by the etch stop layer 129. In some embodiments, the portion 155P of the inner barrier layer 155 under the conductive layer 157 is sandwiched between the conductive layer 157 and the etch stop layer 129. In some embodiments, the conductive via structure 127 is protected by the etch stop layer 129 during the process of forming the conductive via structure 159, which allow increased misalignment tolerance during the etching process for forming the opening of the conductive via structure 159.

In the process steps for the semiconductor device structure 100B, one or more etching processes performed during the formation of the conductive via structure 159 include dry etching using fluorine-containing gas. Since the fluorine-catching layer 133 includes calcium (Ca), such as $CaSiO_2$, the fluorine-containing gas may react with the fluorine-catching layer 133 to transform at least a portion of the fluorine-catching layer 133 into $CaF_2$, thereby reducing or preventing fluorine contamination to the conductive via structures 127 and 159 in the semiconductor device structure 100B, such that the electrical characteristics of the conductive via structures 127 and 159, such as the conductivity, can be consistent.

Embodiments of the semiconductor device structure (e.g., the semiconductor device structures 100A and 100B) and method for preparing the same are provided in the disclosure. In some embodiments, the semiconductor device structure includes a fluorine-catching layer (e.g., the fluorine-catching layer 133) between two dielectric layers (e.g., the second dielectric layer 131 and the third dielectric layer 135), and a conductive via structure (e.g., the conductive via structure 159) penetrating through the fluorine-catching layer and the two dielectric layers.

A fluorine-containing gas may be used as an etchant during the process steps for forming the conductive via structure. For example, fluorine-containing gas may be used during the formation of the opening 150 for the conductive via structure 159 (see FIG. 14), and the partial removal of the outer barrier layer 153 in the conductive via structure 159 may use fluorine-containing gas as well (see FIG. 16). In these cases, the fluorine-containing gas may react with the fluorine-catching layer to transform at least a portion of the fluorine-catching layer into a fluoride (e.g., $CaF_2$). The use of the fluorine-catching layer can reduce fluorine contamination to the conductive features (e.g., the conductive via structures 127 and 159) in the semiconductor device structure, such that the electrical characteristics of the conductive features will not be affected. As a result, the performance, reliability and yield of the semiconductor device structure can be improved.

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a fluorine-catching layer disposed over the second dielectric layer, and a third dielectric layer disposed over the fluorine-catching layer. The semiconductor device structure further includes a conductive via structure penetrating through the third dielectric layer, the fluorine-catching layer, and the second dielectric layer to contact the first dielectric layer.

In another embodiment of the present disclosure, a semiconductor device structure is provided. The semiconductor device structure includes a first dielectric layer disposed over a semiconductor substrate, and a first conductive via structure disposed over the semiconductor substrate and surrounded by the first dielectric layer. The semiconductor device structure also includes a second dielectric layer disposed over the first dielectric layer and covering the first conductive via structure, and a fluorine-catching layer disposed over the second dielectric layer. The semiconductor device structure further includes a second conductive via structure disposed over the first dielectric layer and surrounded by the second dielectric layer and the fluorine-catching layer.

In yet another embodiment of the present disclosure, a method for preparing a semiconductor device structure is provided. The method includes forming a first dielectric layer over a semiconductor substrate, and forming a first conductive via structure in the first dielectric layer. The method also includes forming a second dielectric layer over the first dielectric layer and covering the first conductive via structure, and forming a fluorine-catching layer over the second dielectric layer. The method further includes forming a third dielectric layer over the fluorine-catching layer, and forming a second conductive via structure in the third dielectric layer, the fluorine-catching layer, and the second dielectric layer.

The embodiments of the present disclosure have some advantageous features. By forming the fluorine-catching layer between the second and the third dielectric layers, fluorine contamination to the conductive features in the semiconductor device structure caused by the usage of fluorine-containing gas during the etching processes can be reduced or prevented, such that the electrical characteristics of the conductive features will not be affected. As a result, the performance, reliability and yield of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:
    forming a first dielectric layer over a semiconductor substrate;
    forming a second dielectric layer over the first dielectric layer;
    forming a fluorine-catching layer over the second dielectric layer;
    forming a third dielectric layer over the fluorine-catching layer; and
    forming a conductive via structure penetrating through the third dielectric layer, the fluorine-catching layer, and the second dielectric layer to contact the first dielectric layer,
    wherein the fluorine-catching layer includes calcium (Ca).

2. The method of claim 1, wherein the conductive via structure is formed in direct contact with the fluorine-catching layer.

3. The method of claim 1, wherein the third dielectric layer is separated from the second dielectric layer by the fluorine-catching layer.

4. The method of claim 1, wherein the fluorine-catching layer includes $CaSiO_2$, $CaF_2$, or a combination thereof.

5. The method of claim 1, wherein forming the conductive via structure comprises:
    forming a conductive layer over the first dielectric layer;
    forming an inner barrier layer surrounding the conductive layer; and
    forming an outer barrier layer surrounding the inner barrier layer.

6. The method of claim 5, wherein a portion of the inner barrier layer is sandwiched between the conductive layer and the first dielectric layer, and the portion of the inner barrier layer has a bottom surface that is substantially level with a bottom surface of the outer barrier layer.

7. The method of claim 1, further comprising:
    forming another conductive via structure penetrating through the first dielectric layer to contact the semiconductor substrate.

8. The method of claim 1, further comprising:
    forming an etch stop layer disposed between the conductive via structure and the first dielectric layer.

9. A method for preparing a semiconductor device structure, comprising:
    forming a first dielectric layer over a semiconductor substrate;
    forming a first conductive via structure in the first dielectric layer;

forming a second dielectric layer over the first dielectric layer and covering the first conductive via structure;

forming a fluorine-catching layer over the second dielectric layer;

forming a third dielectric layer over the fluorine-catching layer; and forming a second conductive via structure in the third dielectric layer, the fluorine-catching layer, and the second dielectric layer; and forming an etch stop layer over the first dielectric layer and covering the first conductive via structure before the second dielectric layer is formed, wherein the second conductive via structure is formed over and in direct contact with the etch stop layer.

10. The method of claim 9, wherein the forming the first conductive via structure comprises:

performing a first etching process to form a first opening penetrating through the first dielectric layer;

forming a barrier layer lining a bottom surface and sidewalls of the first opening; and forming a conductive layer in the first opening and over the barrier layer.

11. The method of claim 9, wherein the forming the second conductive via structure comprises:

performing a second etching process to form a second opening penetrating through the third dielectric layer, the fluorine-catching layer, and the second dielectric layer;

forming an outer barrier layer lining a bottom surface and sidewalls of the second opening;

forming an inner barrier layer in the second opening and over the outer barrier layer; and forming a conductive layer in the second opening and over the inner barrier layer.

12. The method of claim 11, the forming the second conductive via structure further comprises:

partially removing the outer barrier layer before the inner barrier layer is formed; and forming the inner barrier layer such that a bottom surface of the inner barrier layer is substantially level with a bottom surface of the outer barrier layer.

13. The method of claim 11, wherein the second etching process includes a dry etching process using an etchant including a fluorine-containing gas.

14. The method of claim 13, wherein the fluorine-catching layer includes $CaSiO_2$, and the fluorine-containing gas reacts with the fluorine-catching layer to transform at least a portion of the fluorine-catching layer into $CaF_2$.

15. The method of claim 11, wherein the fluorine-catching layer has a first fluorine content before the outer barrier layer is formed, the fluorine-catching layer has a second fluorine content after the partially removal of the outer barrier layer, and the second fluorine content is greater than the first fluorine content.

* * * * *